US011215663B2

(12) United States Patent
Reedholm et al.

(10) Patent No.: US 11,215,663 B2
(45) Date of Patent: Jan. 4, 2022

(54) SYSTEMS AND METHODS FOR PARAMETRIC TESTING

(71) Applicant: Reedholm Systems Corporation, Georgetown, TX (US)

(72) Inventors: James R. Reedholm, Ridgefield, CT (US); John M. Fluke, Jr., Mercer Island, WA (US); Simon M. Black, Georgetown, TX (US); Greg J. Petter, Georgetown, TX (US)

(73) Assignee: Reedholm Systems Corporation, Georgetown, TX (US)

( * ) Notice: Subject to any disclaimer, the term of this patent is extended or adjusted under 35 U.S.C. 154(b) by 0 days.

(21) Appl. No.: 17/241,871

(22) Filed: Apr. 27, 2021

(65) Prior Publication Data
US 2021/0333321 A1   Oct. 28, 2021

Related U.S. Application Data

(60) Provisional application No. 63/016,419, filed on Apr. 28, 2020.

(51) Int. Cl.
*G01R 31/28* (2006.01)
(52) U.S. Cl.
CPC ................ *G01R 31/2889* (2013.01)
(58) Field of Classification Search
CPC .. G01R 1/0416; G01R 1/067; G01R 1/07378; G01R 31/2808; G01R 31/67
See application file for complete search history.

(56) References Cited

U.S. PATENT DOCUMENTS

| 5,010,446 A * | 4/1991 | Scannell ................. G01R 1/06 324/763.01 |
| 5,813,876 A | 9/1998 | Rutigliano |
| 2009/0260863 A1* | 10/2009 | Ni ..................... G01R 31/3167 174/260 |
| 2011/0115512 A1 | 5/2011 | Miller |

(Continued)

OTHER PUBLICATIONS

Aug. 6, 2021 International Search Report issued for International Application No. PCT/US2021/029532.
(Continued)

*Primary Examiner* — Tung X Nguyen
(74) *Attorney, Agent, or Firm* — Clements Bernard Baratta; Robert R. Richardson

(57) ABSTRACT

An illustrative parametric testing system includes a motherboard disposable over a wafer prober chuck. First electrical connectors are disposed on and electrically connected to the motherboard. At least one parametric testing cards is disposable in physical and electrical contact with an associated one of the first electrical connectors proximal a pad of a device under test. The parametric testing card includes electronic circuitry configured to receive a digital signal indicative of test plan instructions, generate an analog stimulus signal for a device under test responsive to the test plan instructions, perform an analog measurement of a stimulated device under test, and transmit a digital signal indicative of the measurement of a device under test. The system includes an interface to a computing system. The interface is electrically connectable to the motherboard. The system includes at least one power supply electrically connectable to the motherboard.

20 Claims, 13 Drawing Sheets

(56) References Cited

U.S. PATENT DOCUMENTS

2015/0198631 A1\* 7/2015 Hsu .................. G01R 1/0408
                                                324/754.07
2015/0253380 A1   9/2015 Schiessl et al.

OTHER PUBLICATIONS

Reedholm Instruments Co., Reedholm Systems Manual, Getting Started, P/N 18002, RDS 8.1, Dated 2007, pp. 1-96.
Keysight Technologies, 4080 Series Parametric Testers, Product Brochure, pp. 1-8.

\* cited by examiner

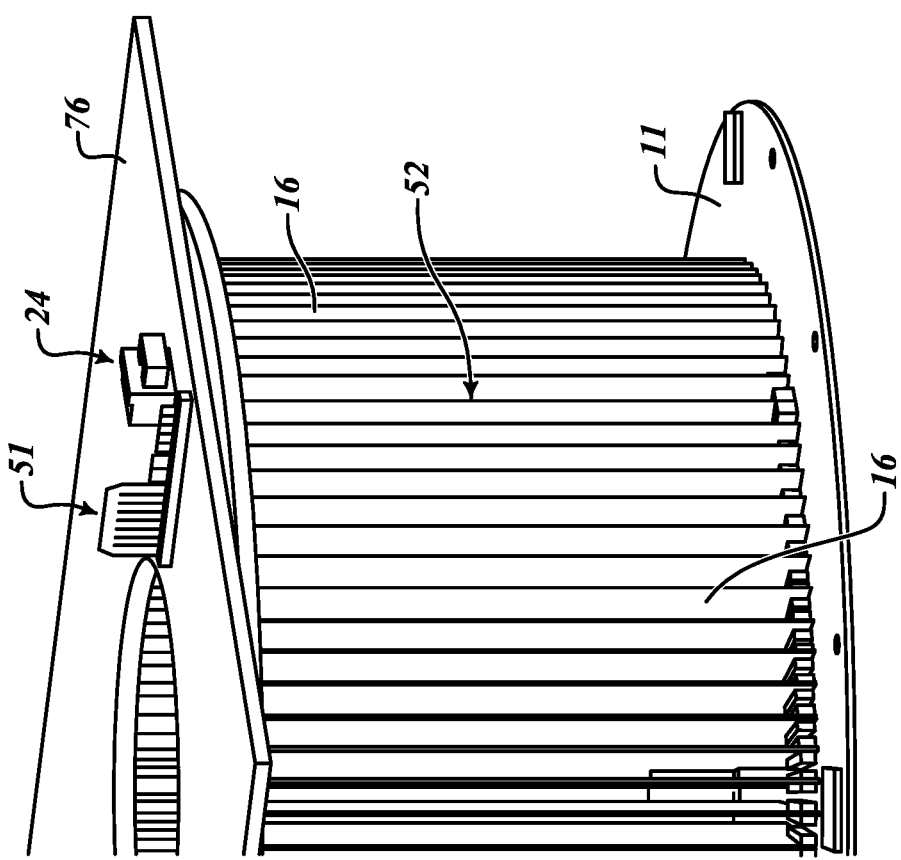
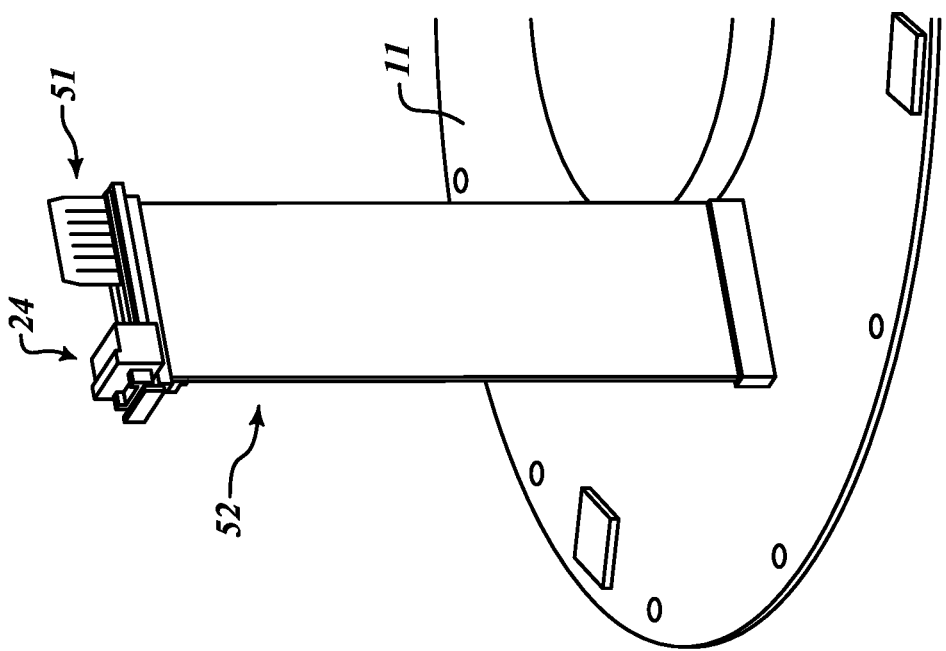

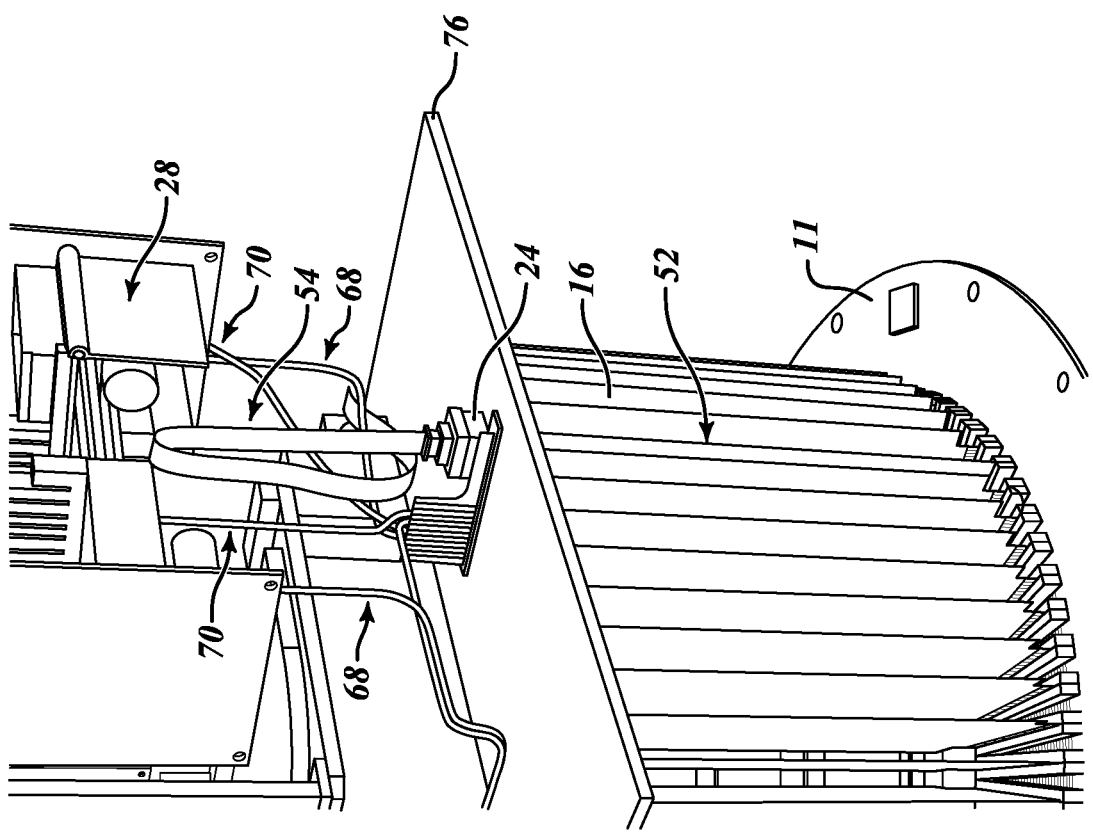

SYSTEMS AND METHODS FOR PARAMETRIC TESTING

CROSS-REFERENCE TO RELATED APPLICATIONS

The present application is related to, and claims the benefit of priority of the filing date of, U.S. Provisional Patent Application No. 63/016,419 filed Apr. 28, 2020, which is herein incorporated by reference in its entirety.

TECHNICAL FIELD

The present disclosure is related to parametric testing.

BACKGROUND

The statements in this section merely provide background information related to the present disclosure and may not constitute prior art.

Parametric testing in semiconductor wafer fabrication provides important data about quality, reliability, and/or stability of the manufacturing process and performance of a device. In general, parametric test involves electrical testing and characterization of four main types of semiconductor devices—resistors, diodes, transistors, and capacitors—and involves various types of measurements, such as voltage, current, capacitance, resistance, and other parameters.

Parametric testers are interfaced to wafer probers and probe cards—physically and through software control. The prober loads wafers from a cassette one at a time onto a chuck so the test system can collect data.

Parametric testing typically measures small test structures (such as a resistor, a diode, a transistor, or a capacitor) that are typically placed in the scribe lane of semiconductor wafers to minimize the wafer area taken up by these devices and that are typically assembled into simple test element groups (TEGs). The test structures are referred to as a device under test (DUT) and are electrically probed via a pad in the scribe lane. The test structures: (1) determine wafer lot conformance to specifications; (2) monitor a process to maintain and enhance die yields; (3) develop characteristics of processes, devices, and products; (4) study reliability, including wearout characteristics; and (5) perform final test of simple discrete semiconductor devices.

Legacy parametric test systems (legacy systems) may entail various limitations. For example, some parametric test data obtained via legacy systems may be unreliable. This unreliability may be due in part to connecting probes to legacy systems' stimulus and measurement instrumentation through: (1) tens, dozens, and (in some legacy systems) hundreds of feet of guarded, shielded analog cable—which can add parasitic parameters and degrade measurements; (2) a switching matrix; and (3) a rack mounted card cage containing instrument printed circuit boards and IEEE-488 instruments. Parasitic series resistance, series inductance, and shunt capacitance of distributed circuit elements are generally three orders of magnitude larger than the intrinsic resistance, inductance, and capacitance of the DUT pad. It will be appreciated that parasitic distributed circuit elements can degrade test step execution speed by at least one order of magnitude and can inflict oscillations that can potentially render the stimulus and measurement compromised.

Moreover, legacy systems are large. Some legacy systems are rack-mounted systems that may have large card cages (such as around nineteen inches or so) and that may entail sufficient space to accommodate up to hundreds of feet of cable. As an example, a 3-inch zero insertion force (ZIF) plug can have 17 feet of analog cabling. Some legacy systems can occupy up to sixteen square feet of area of a semiconductor fabrication facility. At $50K/ft$^2$ for fabrication space, a legacy system that occupies 16 ft$^2$ entails $800K in costs for fabrication space.

Furthermore, a legacy system's switching matrix can increase time and effort entailed in parametric testing. Legacy systems use a matrix of switching relays to connect the instrumentation to the test probes. Hot switching relays under heavily-loaded signal conditions can increase static contact resistance, thereby contributing to shortening the useful life of components. In addition, stuck relays may result in re-probing wafers and may lead to longer test execution times (and propensity of relays to get stuck is a major issue with legacy systems). With a traditional switch matrix system, several relay closures are entailed in configuring a test, compounding such problems associated with relays. For example, seven relay closures are required to configure a test in which in a first source/monitor unit (SMU) is connected to a gate pin of a DUT and common ground, a second SMU is connected to a drain pin of the DUT and common ground, and a source pin of the DUT is connected to common ground.

Legacy systems can also experience some performance issues. For example, test time of some legacy systems can average around 1 hour per 300 mm wafer (inclusive of in-line sampling and end-of line test). For in-line testing, five wafers are tested per lot, with nine to fifteen sites tested per pass, but several passes are made. On average, wafers are tested five times in-line and one-time end-of-line. Test cell availability is assumed to be 85 and 90 percent, so each cell can process 600 wafers/month on a 24/7 cycle. At a fabrication capacity of 60,000 wafers/month, upwards of 100 testers may be entailed. Therefore, the speed of conducting tests and cost of parametric test systems may be a consideration.

SUMMARY

Disclosed embodiments include illustrative devices, systems, and methods for parametric testing.

In an embodiment, an illustrative device for parametric testing is provided. An illustrative parametric testing card includes a printed circuit board disposable over a chuck of a silicon wafer prober and proximal a probe for a pad of a device under test. Electrical connectors are disposed on the printed circuit board. Electronic circuitry is disposed on the printed circuit board and is electrically connected to the electrical connectors. The electronic circuitry is configured to receive a digital signal indicative of test plan instructions, to generate an analog stimulus signal for a device under test responsive to the test plan instructions, to perform an analog measurement of a stimulated device under test, and to transmit a digital signal indicative of the measurement of a device under test.

In another embodiment, an illustrative system for parametric testing is provided. An illustrative parametric testing system includes a motherboard disposable over a chuck of a silicon wafer prober. First electrical connectors are disposed on the motherboard and are electrically connected to the motherboard. The system includes at least one parametric testing card. Each parametric testing card is disposable in physical and electrical contact with an associated one of the first electrical connectors proximal a probe for a pad of a device under test. Each parametric testing card includes electronic circuitry configured to receive a digital signal indicative of test plan instructions, to generate an analog stimulus signal for a device under test responsive to the test plan instructions, to perform an analog measurement of a stimulated device under test, and to transmit a digital signal indicative of the measurement of a device under test. The system includes an interface to a computing system, and the interface is electrically connectable to the motherboard. The system also includes at least one power supply electrically connectable to the motherboard.

In another embodiment, an illustrative method for parametric testing is provided. An illustrative method includes disposing a parametric testing system over a chuck of a silicon wafer prober; establishing electrical contact between the parametric testing system and at least a first pad of an associated device under test of a silicon wafer; providing to a first pad of the device under test an analog stimulus signal from a first testing card disposed proximal the first pad; measuring a resultant analog parameter from the first pad of the stimulated device under test by the first testing card; and transmitting a digital signal indicative of the measured resultant analog parameter.

Further features, advantages, and areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way. The components in the figures are not necessarily to scale, with emphasis instead being placed upon illustrating the principles of the disclosed embodiments. In the drawings:

FIG. 6A is a perspective view of the extender board of FIG. 4 with a computer interface mounted on the motherboard of FIG. 4.

FIGS. 6B and 6C are perspective views of the motherboard of FIG. 4 populated with parametric testing cards of FIG. 4 and the extender board with a computer interface of FIG. 6A.

DETAILED DESCRIPTION

The following description is merely illustrative in nature and is not intended to limit the present disclosure, application, or uses.

Figure 1:
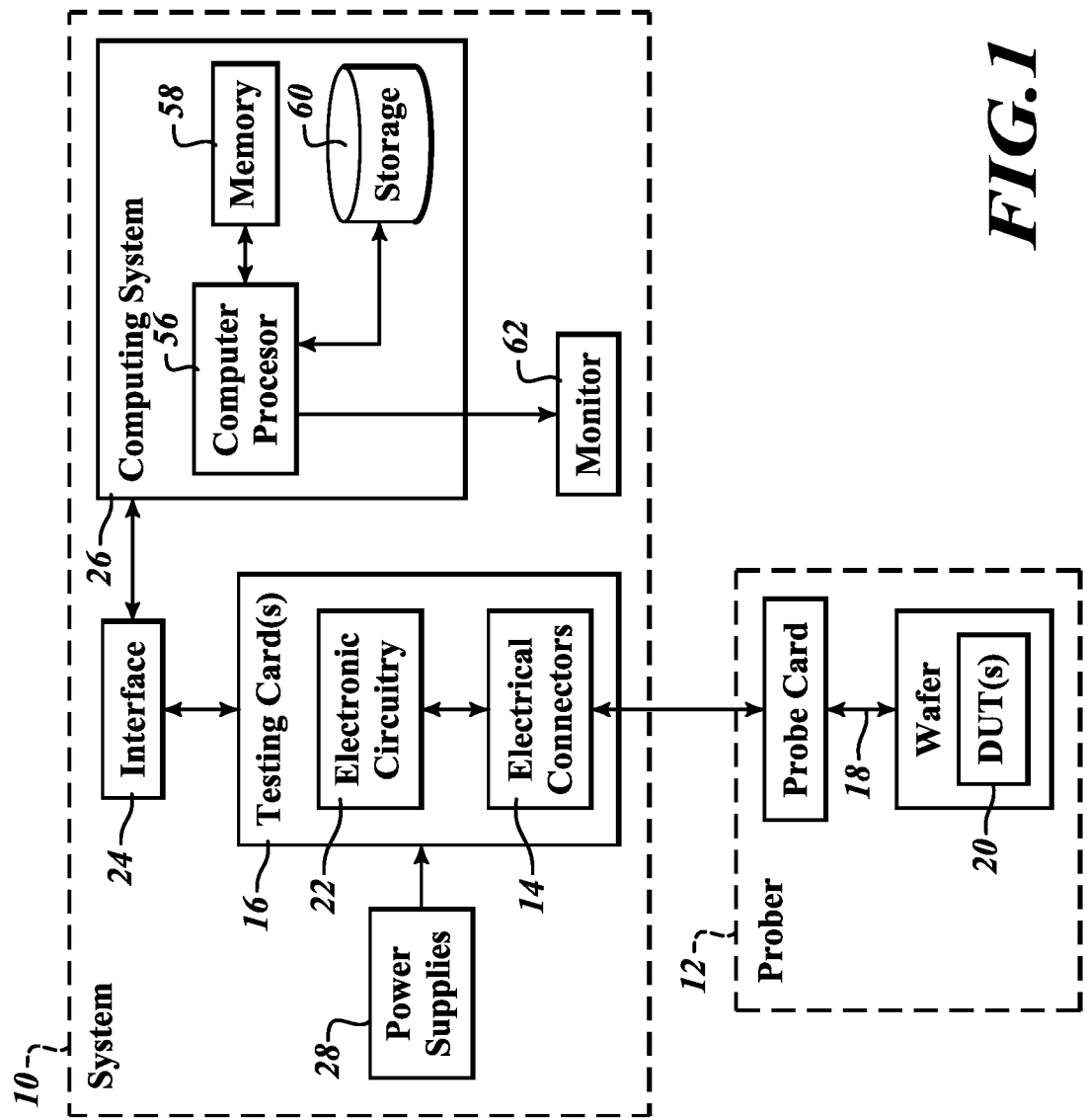
FIG. 1 is a block diagram of an illustrative system for parametric testing.
Figure 2:
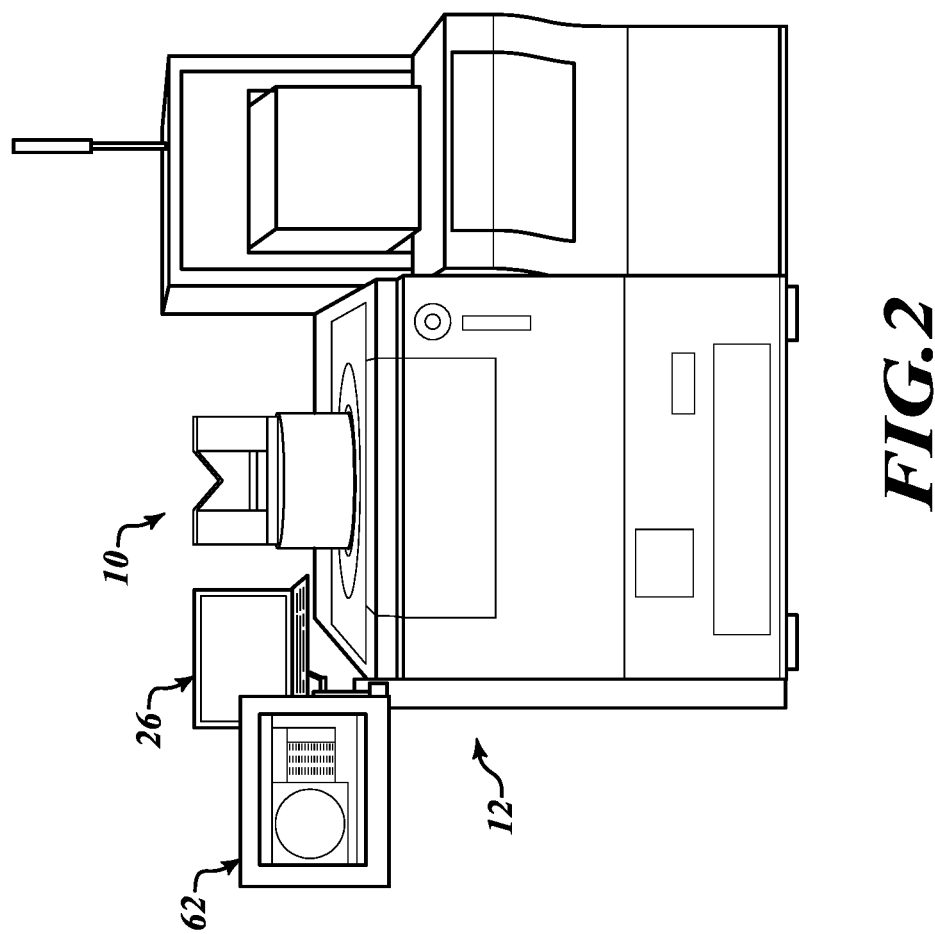
FIG. 2 is a perspective view of the system of FIG. 1 installed on a wafer prober.
Figure 3:
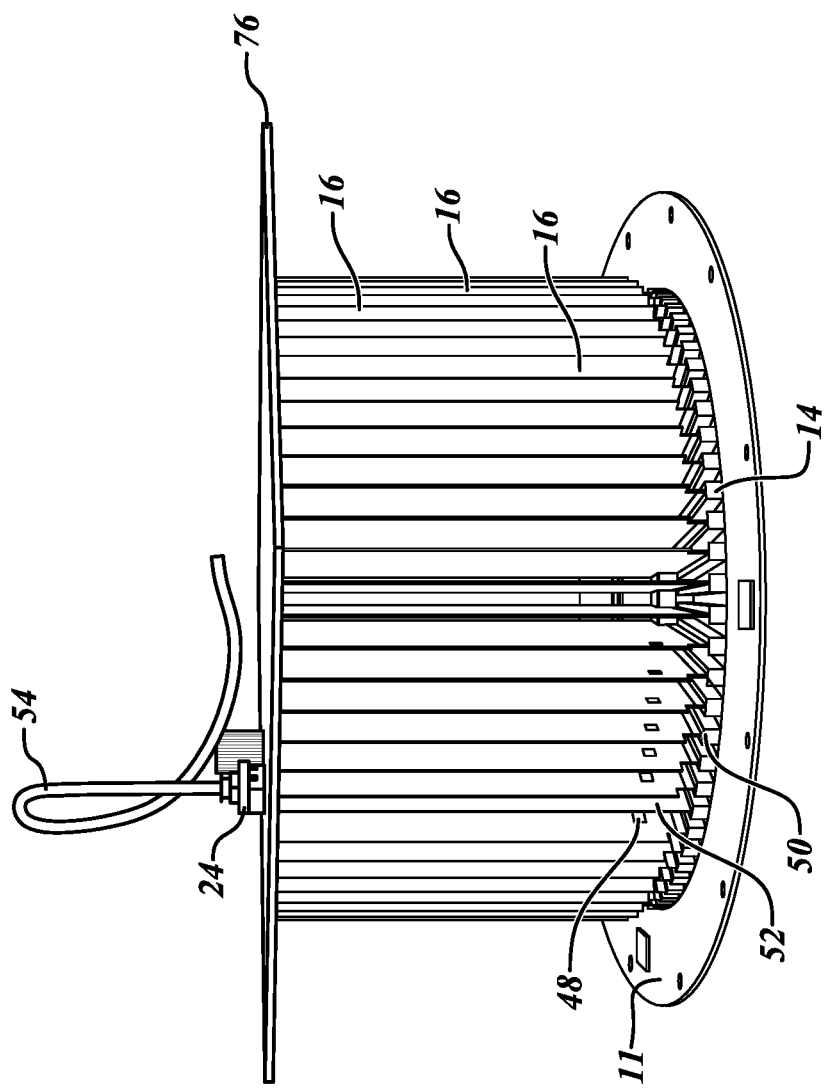
FIG. 3 is a perspective view of components of the system of FIG. 1.

Given by way of overview, various disclosed embodiments include illustrative devices, systems, and methods for parametric testing. Referring to FIGS. 1, 2, and 3 an illustrative parametric testing system 10 includes a motherboard 11 disposable over a chuck of a silicon wafer prober 12. Electrical connectors 14 are disposed on the motherboard 11 and are electrically connected to the motherboard 11. The system 10 includes at least one parametric testing card 16. Each parametric testing card 16 is disposable in physical and electrical contact with an associated one of the electrical connectors 14 proximal a probe 18 for a pad of a device under test (DUT) 20. Each parametric testing card 16 includes electronic circuitry 22 configured to receive a digital signal indicative of test plan instructions, to generate an analog stimulus signal for the DUT 20 responsive to the test plan instructions, to perform an analog measurement of a stimulated DUT 20, and to transmit a digital signal indicative of the measurement of the DUT 20. The system 20 includes an interface 24 to a computing system 26, and the interface 24 is electrically connectable to the motherboard 11. The system 10 also includes at least one power supply 28 electrically connectable to the motherboard 11.

From the above overview and from non-limiting examples provided below by way of illustration only, it will be appreciated by those of skill in the art that in various embodiments all of the functions entailed in stimulating and measuring a DUT 20 of a wafer may be provided in one parametric testing card 16 that is disposable physically proximal a pad for an associated DUT 20. It will also be appreciated by those of skill in the art that the parametric testing card 16 is electrically connectable to electrically communicate analog electrical signals with an associated DUT 20 only via traces on the parametric testing card 16, traces on the motherboard, the probe 18, the pad, and the wafer. It will further be appreciated that, as a result, in various embodiments an analog signal path may be on the order of inches long instead of tens or dozens of feet long as is currently known. Thus, such embodiments may help contribute to eliminating tens, dozens, or possibly hundreds of feet of analog signal path length between a DUT 20 and a testing system.

For example, it will be appreciated that in various embodiments reduction of analog signal path length from tens or dozens or possibly hundreds of feet to inches may help contribute to reducing shunt capacitance. For example and without limitation, in various embodiments shunt capacitance may be reduced by hundreds of picofarads over that entailed in currently known methods (with tens or dozens of feet of analog signal path length). Given by way of non-limiting example, various embodiments may help contribute to reducing shunt capacitance by around 700 picofarads or so over that entailed in currently known methods with tens or dozens of feet of analog signal path length.

It will also be appreciated that in various embodiments reduction of analog signal path length from tens or dozens or possibly hundreds of feet to inches may help contribute to reducing series inductance in addition to shunt capacitance.

For example, various embodiments may help contribute to a reduction in series inductance and shunt capacitance by around three orders of magnitude or so, thereby helping contribute to reducing settling times for analog stimulus and measurement operations. It will be appreciated by those of skill in the art that such possible reductions of settling times for analog stimulus and measurement operations can possibly help contribute to reducing the possibility that the electrical connection between the testing card 16 and the probe tip may establish a resonant circuit that may possibly lapse into oscillation.

It will also be appreciated by those of skill in the art that various disclosed embodiments may be disposed on wafer probers and, as such, do not occupy any wafer fabrication floor space in addition to that occupied by the wafer prober itself. As such, various embodiments may help contribute to reducing use of up to sixteen square feet or so of area of a semiconductor fabrication facility. At $50K/ft$^2$ for fabrication space, various embodiments may help contribute to reducing up to around $800K in costs for fabrication space over a legacy system.

Now that an overview has been provided, illustrative details of non-limiting examples will be set forth below by way of illustration and not of limitation.

Figure 4:
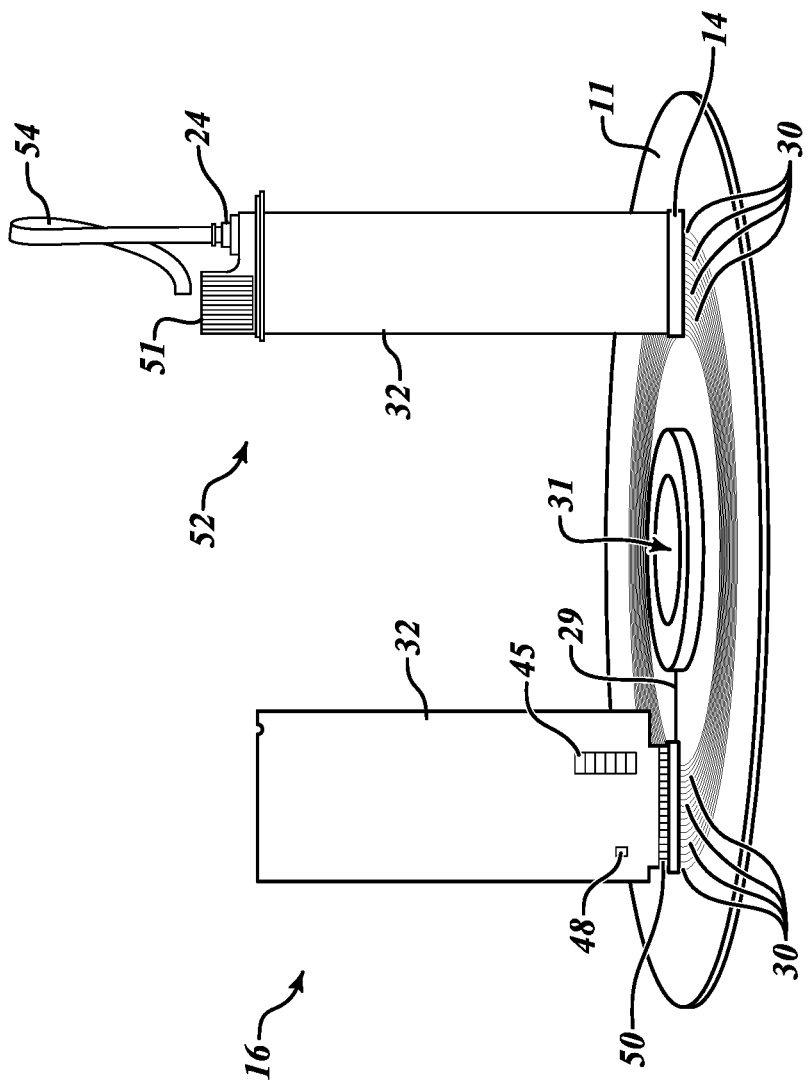
FIG. 4 is a perspective view of an illustrative parametric testing card and an illustrative extender board mounted on an illustrative motherboard.

Referring additionally to FIG. 4, in various embodiments and as shown in FIGS. 3 and 4, the electrical connectors 14 are disposed on the motherboard 11 and are electrically connected to the motherboard 11. In various embodiments the electrical connectors 14 are disposed about the motherboard 11 in an annular array. In various embodiments the electrical connectors 14 suitably are sockets that allow for insertion and removal of the parametric testing cards 16 with little force. In such embodiments, the electrical connectors suitably include zero-insertion-force connectors or the like.

In various embodiments and as shown in FIG. 4, the electrical connectors 14 are electrically connected to the motherboard 11 via electrically-conductive traces 30 defined on the motherboard 11. In such embodiments, the traces 30 are radially spaced apart from each other. As will be described below, each trace 30 suitably corresponds to an associated electrical connection with an associated electrical connector on the parametric testing card 16. For example, in various embodiments the electrical connectors 14 and the traces 30 cooperate to provide electrical connections with the electronic circuitry 22 of the parametric testing cards 16 for functions such as: communication with the computing system 26; biasing from the at least one power supply 28; synchronization to enable stimulus and measurement coordination per test plan steps; and the like.

In various embodiments the motherboard 11 is configured to electrically connect individual electrical connectors 14 with a probe 18 associated with a DUT 20. As shown in FIG. 4, electrical traces 29 extend radially inwardly on the motherboard 11 from the connectors 14 (not shown in FIG. 4 for purposes of clarity) toward a central portion 31 of the motherboard 11. For purposes of clarity only one trace 29 is shown. Each trace 29 is electrically connected to its associated connector 14 to electrically communicate analog signals between an associated parametric testing card 16 and a pad for a DUT 20. A suitable probe card or the like is insertable into the central portion 31 and is attached to the motherboard 11. In various embodiments, the probe card may be replaced without removing the parametric testing cards 16.

The probe card electrically contacts the traces 29 in a known manner, thereby electrically connecting the traces 29 (and, as a result, analog inputs and outputs of an associated parametric testing card 16) and a pad for a DUT 20 via a probe 18. As such, analog signal length in the system 10 is the length of the traces 29. Thus, analog signal length in the system 10 is on the order of an inch or inches—as opposed to tens or dozens or hundreds of feet in legacy systems.

It will be appreciated that the motherboard 11 may have any size as desired for a particular application. Given by way of illustration only and not of limitation, in some embodiments the motherboard 11 may be a twelve inch motherboard that is commonly used in conjunction with known probers. In such embodiments, up to one hundred or so of the electrical connectors 14 may be disposed in an annular array on the motherboard 11. However, it will be appreciated that no limitation regarding size of the motherboard 11 is intended and no such limitation is to be inferred.

Figure 5:
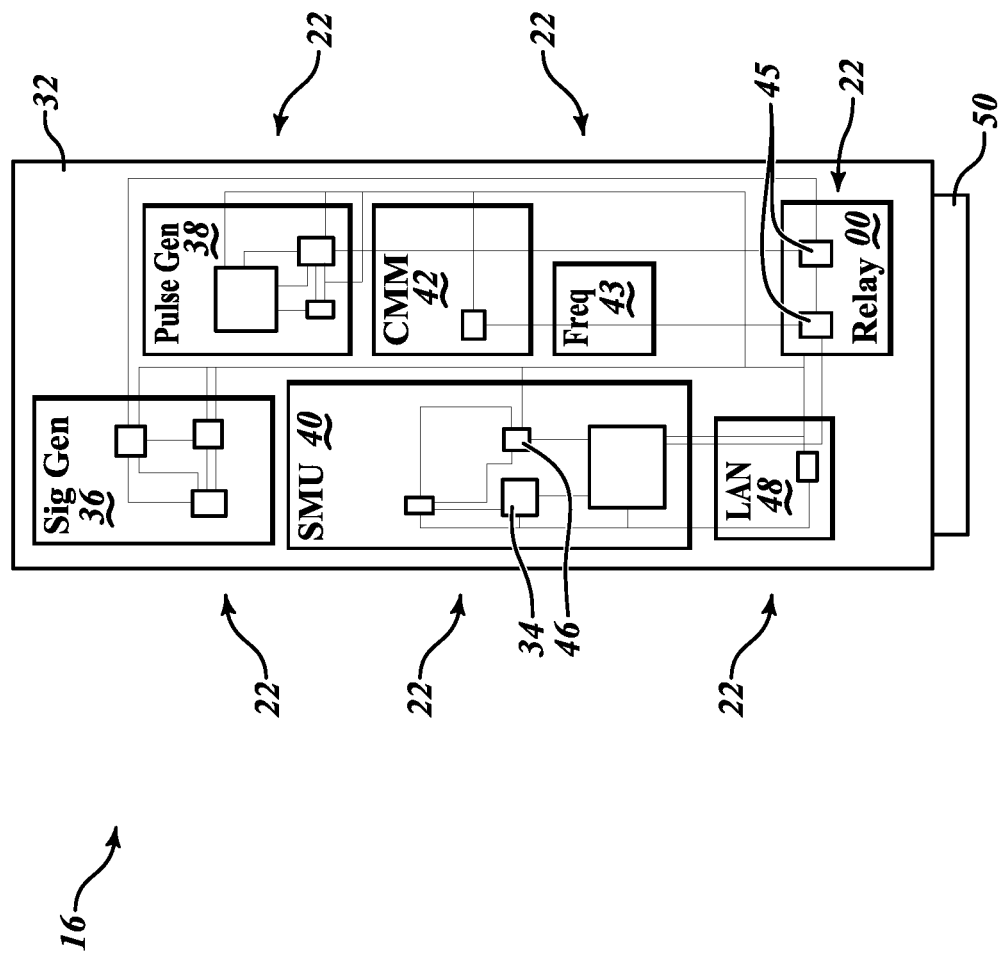
FIG. 5 is a block diagram in partial schematic form of the parametric testing card of FIG. 4.

Referring additionally to FIG. 5, in various embodiments each parametric testing card 16 includes a printed circuit board 32. The electronic circuitry 22 is disposed on the printed circuit board 32. In various embodiments, the electronic circuitry 22 suitably includes electronic circuits such as, without limitation, a digital-to-analog converter circuit 34, a signal generator circuit 36, a pulse generator circuit 38, a source measurement circuit 40, a capacitance measurement circuit 42, a frequency counter circuit 43, a switching circuit 44, an analog-to-digital converter circuit 46, and/or a digital data transceiver circuit 48. It will be appreciated that the electronic circuitry 22 may include other circuits as desired to perform any other desired functions for a particular application. In various embodiments the electronic circuits may include integrated circuits, such as without limitation surface mount integrated circuits, disposed on the printed circuit board 32.

In various embodiments the electronic circuitry 22 is configured to stimulate the DUT 20 in response to instructions according to a test plan and to measure a resultant response. In various embodiments the electronic circuitry 22 is configured to force and measure direct current (DC) electrical currents and voltages from femtoamps and microvolts to amps and hundreds of volts. For example, a DC current may be forced (that is, generated and supplied to the DUT 20 to stimulate the DUT 20) and a resultant DC voltage may be measured. As another example, a DC voltage may be forced and a resultant DC current may be measured. It will be appreciated that output impedance of the electronic circuitry 22 that functions as an analog voltage source is approximately zero and that input impedance of the electronic circuitry 22 that measures voltage is extremely high (because such input impedance is ideally infinite).

In various embodiments the signal generator circuit 36 is configured to generate waveforms, such as without limitation a sine wave, a square wave, a triangle wave, and the like. In various embodiments the signal generator circuit 36 may include suitable circuits such as a digital-to-analog converter and waveform generator, a digital-to-analog converter, and a voltage and current output driver. In various embodiments, output frequency of the signal generator circuit 36 may range without limitation from 0 Hz to around 10 MHz or so. However, it will be appreciated that any output frequency may be selected as desired for a particular application.

In various embodiments the pulse generator circuit 38 is configured to generate and provide a pulsed voltage or current. In various embodiments the pulse generator circuit 38 may include suitable circuits such as a digital-to-analog converter and waveform generator, a digital-to-analog converter, and a voltage and current output driver. In various embodiments, pulses generated by the pulse generator circuit 38 may have without limitation a pulse period of 1 μs to 200 s, a pulse width of 200 ns to 200 s, a pulse delay of 100 ns to 835 ms, and rise/fall times of around 100 ns, 1 μs, 10 μs, 100 μs, or 1 ms. However, it will be appreciated that any pulse period, pulse width, pulse delay, and rise/fall time may be selected as desired for a particular application.

In various embodiments the source measurement circuit 40 is configured to force a DC voltage and measure the resulting DC current or force a DC current and measure the resulting DC voltage. In various embodiments the source measurement circuit 40 may include suitable circuits such as a data acquisition circuit, a parametric measurement unit, at least one of the digital-to-analog converter circuits 34, and at least one of the analog-to-digital converter circuits 46. In various embodiments the digital-to-analog converter circuit 34 forces the current or voltage and the analog-to-digital converter circuit 46 converts the analog measurement into a digital signal that can be transmitted to the computing system 26 via the interface 24. In various embodiments the forced DC voltage may range up to around 25V. However, in some embodiments the forced DC voltage may be greater than 50V as desired for a particular application. In various embodiments the forced DC current may range from 100 nA to 100 mA. However it will be appreciated that any range of DC voltage and current may be forced as desired for a particular application. In various embodiments resultant DC voltage may be measured from 250 mV to 25V (or greater than 50V if applicable). In some embodiments resultant DC current may be measured from 100 nA to 100 mA. However, in some other embodiments resultant low DC current may be measured from 100 pA to 100 nA. However it will be appreciated that any range of resultant DC voltage and current may be measured as desired for a particular application.

In various embodiments the capacitance measurement circuit 42 is configured to measure capacitance actively from femtofarads to nanofarads based upon instructions of a test step in a test plan. In various embodiments excitation frequency can range from around 100 KHz to up to around 1 MHz or so. However, it will be appreciated that any excitation frequency can be used as desired for a particular application.

In various embodiments the frequency counter circuit 43 is configured to measure frequency based upon instructions of a test step in a test plan. In various embodiments the measured frequency may range from around 10 Hz to around 350 MHz or so. However, it will be appreciated that any frequency (from 0 Hz up to several GHz) may be measured as desired for a particular application.

In various embodiments the switching circuit 44 may include relays 45, such as reed relays like surface mount reed relays. The relays of the switching circuit electrically connect desired circuits of the electrical circuitry 22 with the trace 29 to electrically communicate forced and resultant analog signals with the DUT 20. Thus, in various embodiments use of the reed relays 45 eliminates use of a traditional switch matrix of mechanical relays (and their attendant delays for contact bounce) used in legacy systems. It will be appreciated that use of the reed relays 45 can thus help contribute to reducing series resistance and can help contribute to improving test step execution speed.

In various embodiments the digital data transceiver circuit 48 is any suitable transceiver configured to transmit and receive digital data to and from the computing system 24. Given by way of illustration only and not of limitation, in various embodiments the digital data transceiver circuit 48 may include IEEE 803.11 LAN Ethernet transceiver, a uniform serial bus (USB) transceiver (such as for example without limitation USB 3.x or USB 4), or the like.

In various embodiments, electrical connectors 50 are disposed on each printed circuit board 32. The electrical connectors 50 of a given printed circuit board 32 are disposable in physical and electrical contact with an associated electrical connector 14. In various embodiments the connectors 50 are electrically connected with the electronic circuitry 22. In various embodiments, the electrical connectors 50 suitably are electrically-conductive traces defined on the printed circuit board 32 and disposed at an edge of the printed circuit board 32. In such embodiments, the electrical connectors 50 suitably are edge connectors that are intended to plug into a matching electrical connector 14.

Thus, it will be appreciated that a single parametric testing card 16 can provide all of the functionality entailed in a parametric testing system 10. As such, it will be further appreciated that, in various embodiments, a parametric testing system 10 need not include more than one parametric testing card 16 as desired for a particular application. However, it will also be appreciated that a parametric testing system 10 may include any number of parametric testing cards 16 (and associated electrical connectors 14 disposed on the motherboard 11) as desired for a particular application. In various embodiments and depending on size of the motherboard 11 and wafer, a parametric testing system 10 may include up to one hundred or more parametric testing cards 16 (and associated electrical connectors 14 disposed on the motherboard 11).

In various embodiments and as shown in FIG. 4 and referring additionally to FIGS. 6A, 6B, 6C, and 6D, an extender board 52 is disposable in physical and electrical contact with an associated one of the electrical connectors 14. In various embodiments the extender board 52 is configured to electrically connect the at least one power supply 28 with the motherboard 11 and to connect the interface 24 with the motherboard 11.

In various embodiments the extender board 52 includes a printed circuit board 32 with electrical traces (not shown) disposed thereon. The electrical traces terminate at one end as electrical connectors 50 (not shown) that are configured as edge connectors to be physically inserted in electrical contact into an associated electrical connector 14 disposed on the motherboard 11. Some of the traces terminate at another end of the printed circuit board 32 as electrical connectors 51 that are electrically connectable to the at least one power supply 28.

In various embodiments the interface 24 suitably is disposed adjacent the electrical connectors 51 at the other end of the printed circuit board 32 of the extender board 52. In various embodiments the interface 24 suitably is a copper-to-plastic-optical-fiber (POF) converter device, such as without limitation a Firecomms EDL300 interface or the like. In such embodiments, a cable 54 such as a POF cable is electrically coupled to the interface 24 for operative coupling with the computing system 26. It will be appreciated that, in such embodiments, use of the POF cable 54 can help contribute to providing electrical isolation of data operatively communicated via the POF cable 54.

In various embodiments the computing system 26 is operatively couplable to the interface 24. In some embodiments and as discussed above, such operative coupling may be effected via the POF cable 54 (FIGS. 3 and 4) to effect data communication via an IEEE 803.11 LAN Ethernet standard. However, in some other embodiments the cable 54 may include a copper-wire cable Ethernet cable that may be used as desired as the interface 24 for operative coupling with the computing system 26. In some other embodiments, the cable 54 may include a copper-wire cable USB cable that may be used as desired as the interface 24 for operative coupling with the computing system 26 using, for example and without limitation, USB 3.x or USB 4).

In various embodiments and as shown in FIG. 1, the computing system 26 includes any suitable computer, such as a laptop computer, a notebook computer, a tablet computer, a desktop computer, a network computer, a computer server, a processor, or the like. However, it will be appreciated that, as shown in FIG. 2, a laptop computer, a notebook computer, a tablet computer, or a processor is smaller than a desktop computer and, as such, occupies less space than a desktop computer when placed over and/or adjacent the prober 12.

As also shown in FIG. 1, in various embodiments the computing system 26 includes a computer processor 56, memory 58, and storage 60. In various embodiments, the computer processor 56 includes any suitable computer processor known in the art. The memory 58 includes any suitable computer memory device known in the art, such as without limitation random-access memory of any type, that stores instructions (such as without limitation for an operating system for the computer processor 56 and for computer programs or applications) being executed by the computer processor 56. In various embodiments the storage 60 may include without limitation any suitable non-volatile memory whatsoever, a storage drive, array, cloud storage system, or the like. In various embodiments the storage 60 includes instructions for computer programs or applications that are loadable into the memory 58 for execution by the computer processor 56. In various embodiments the storage 60 can also include data, that may be stored in a database, spreadsheet, or the like, that may be accessed by a computer program or application being executed by the computer processor 56.

Given by way of non-limiting example, in various embodiments the computing system 26 may execute instructions for implementing a test plan. In such embodiments, the computing system 26 may send commands to the system 10 via the interface 24 to effectuate the test plan. In some embodiments the test plan may be for a different system or for a legacy system. In such embodiments, the computing system 26 may convert the test plan to be usable with the system 10. Regardless, in various embodiments the system 10 may send test results to the computing system 26 via the interface 24. The test results may include test conditions, including physical values such as temperature and moisture and the like, system values such as serial numbers of components and up-time and the like, or any other parameter or variable that may affect a test.

Given by way of another non-limiting example, in various embodiments the storage 60 may include a database or spreadsheet that may store information regarding the system 10. In such embodiments. The computing system 26 may store or retrieve data from the database or spreadsheet, including test plans, converted test plans, commands, and test results.

In various embodiments the computing system 26 may be operatively coupled to a monitor 62. In such embodiments, the monitor 62 suitably may be used to display, among other things and without limitation, commands, test results, conditions, and the like. The monitor 62 may be any suitable monitor or display device known in the art for displaying information from a computing system. In some embodiments the monitor 62 may be provided as part of a computer, such as a laptop computer, a notebook computer, a tablet computer, or the like. In some embodiments, the monitor 62 may be separate from a computer, such as a desktop computer, a computer server, or the like. It will be appreciated that the system 10 is not limited to use of one monitor 62 and that any number of monitors 62 may be used as desired for a particular application.

Figure 6D:
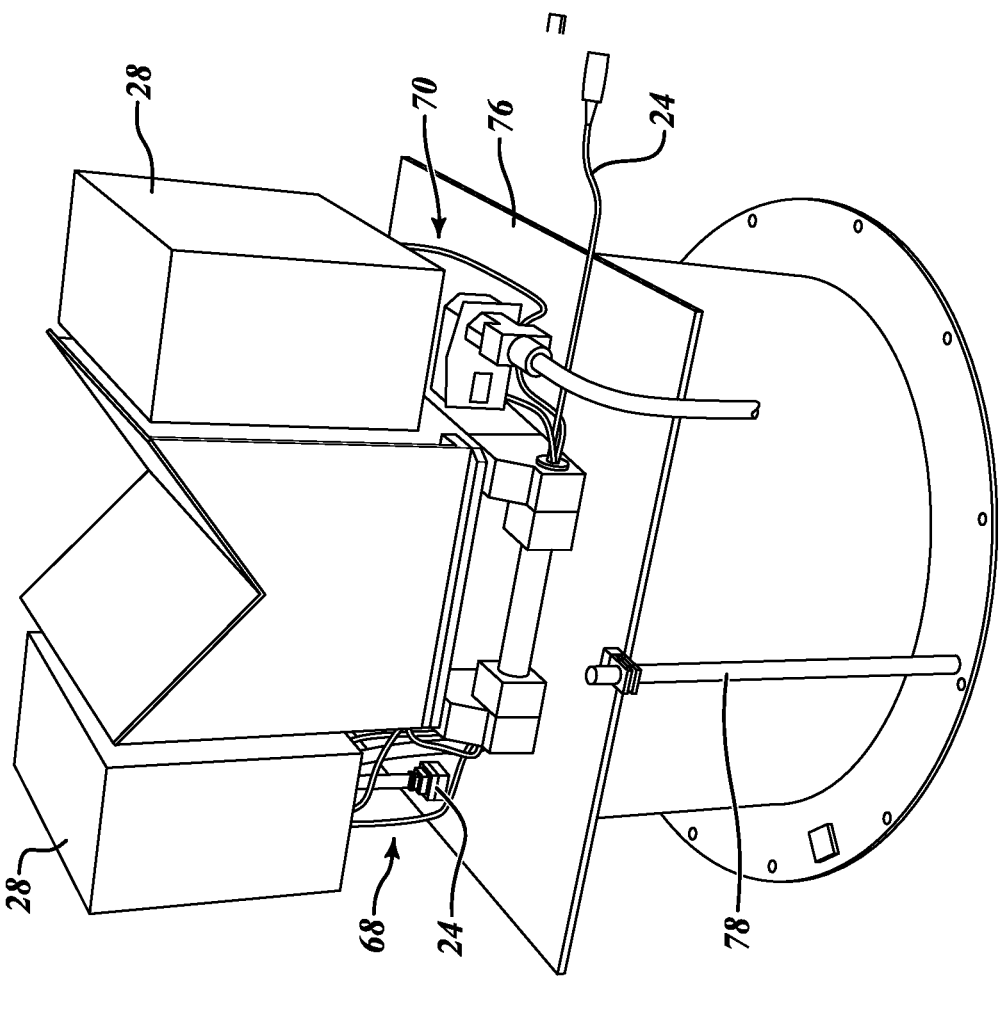
FIG. 6D is a perspective view of additional components of the system of FIG. 1.
Figure 7B:
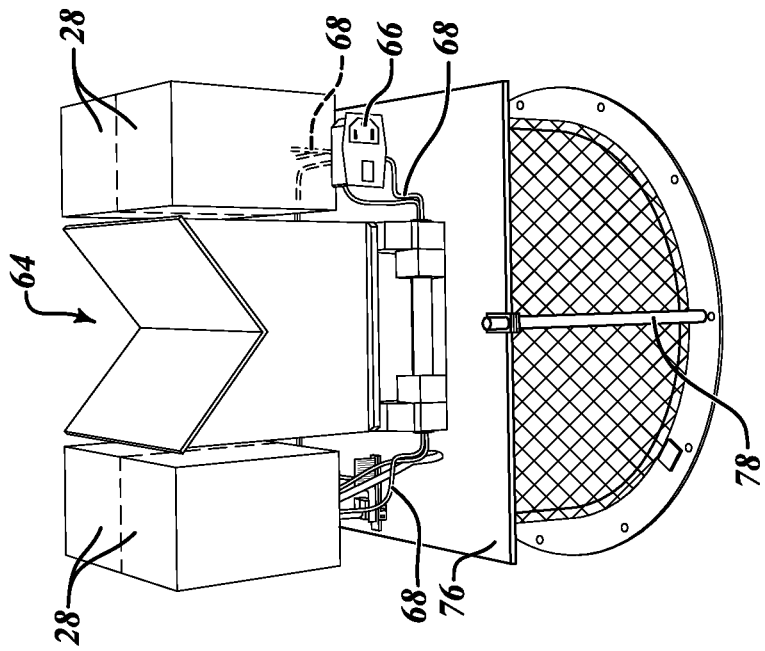
FIG. 7B is a rear perspective view of illustrative power supplies of the system of FIG. 1.
Figure 7A:
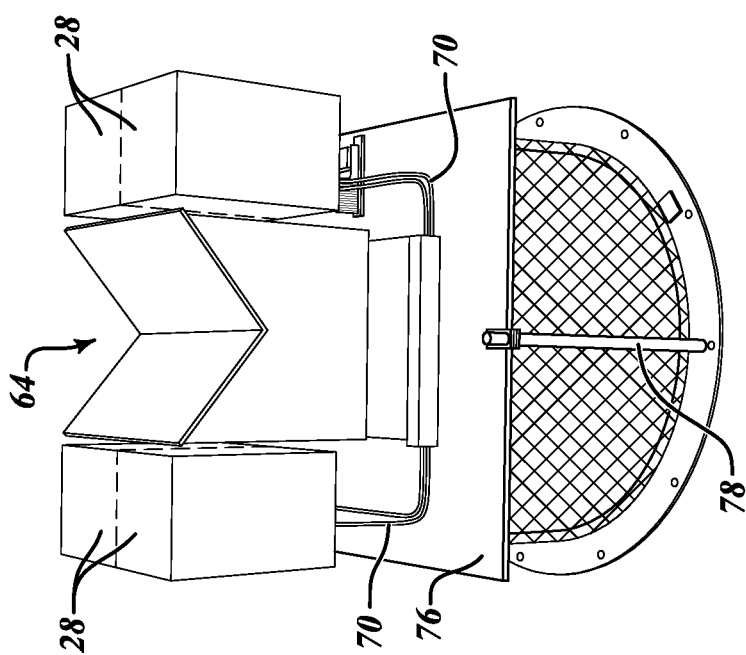
FIG. 7A is a front perspective view of illustrative power supplies of the system of FIG. 1.

Referring additionally to FIGS. 7A and 7B, in various embodiments the at least one power supply 28 is mounted in a housing 64 (part of which is not shown for purposes of clarity). In various embodiments, two of the power supplies 28 are provided. The power supply 28 receives input AC voltage in a range from 100-240 VAC via a line connector 66 (FIG. 7B), such as without limitation an IEC 348 device, and AC wire harnesses 68 (FIG. 7B; also shown in FIGS. 6C and 6D).

The at least one power supply 28 provides DC bias voltages for the electronic circuitry 22 of the parametric testing cards 16. Given by way of illustration only and not of limitation, in various non-limiting embodiments the power supplies 28 may provide DC output voltages of 3.3 VDC, 5 VDC, and 48 VDC. However, it will be appreciated that the power supply 28 may output any DC voltage as desired for a particular application and no limitation to any output voltage is intended. In various embodiments, DC output of the at least one power supply 28 is provided via DC wire harnesses 70 (FIG. 7A; also shown in FIGS. 6C and 6D) that are electrically attachable to the electrical connectors 51.

Figure 8:
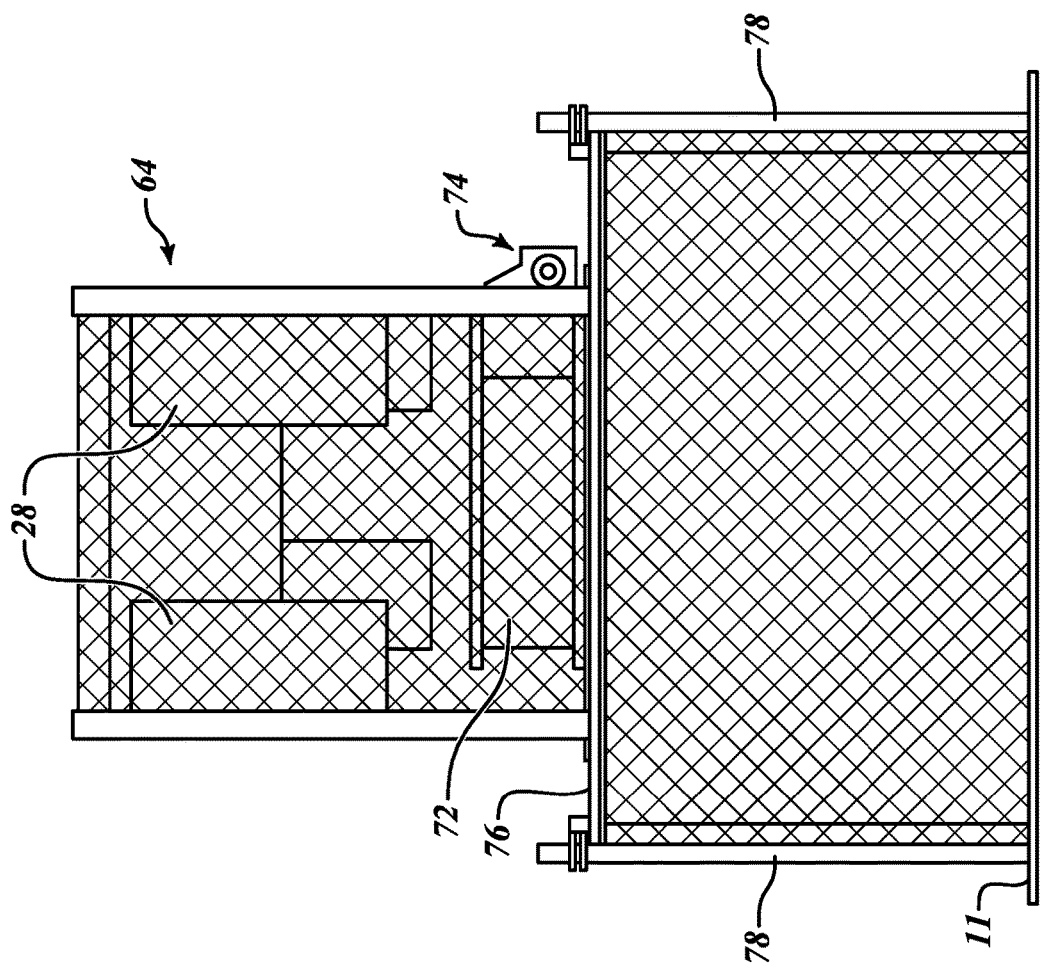
FIG. 8 is a side perspective view of the system of FIG. 1.
Figure 9A:
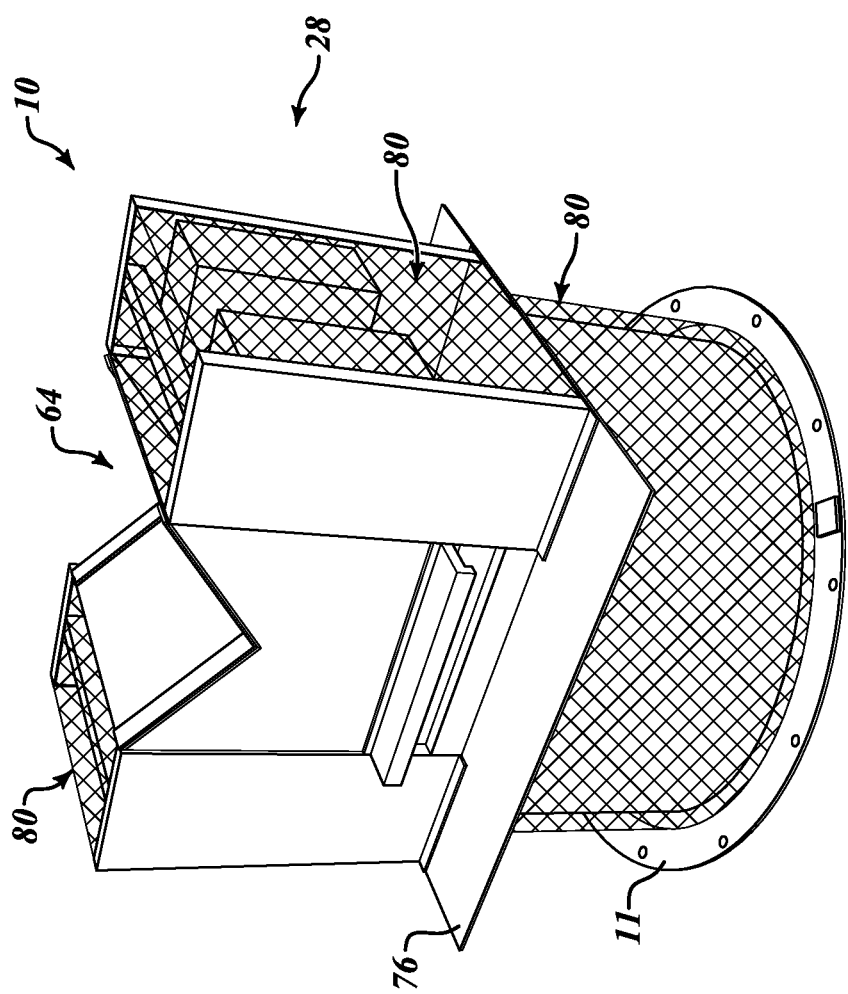
FIG. 9A is a front perspective view of the system of FIG. 1.
Figure 9B:
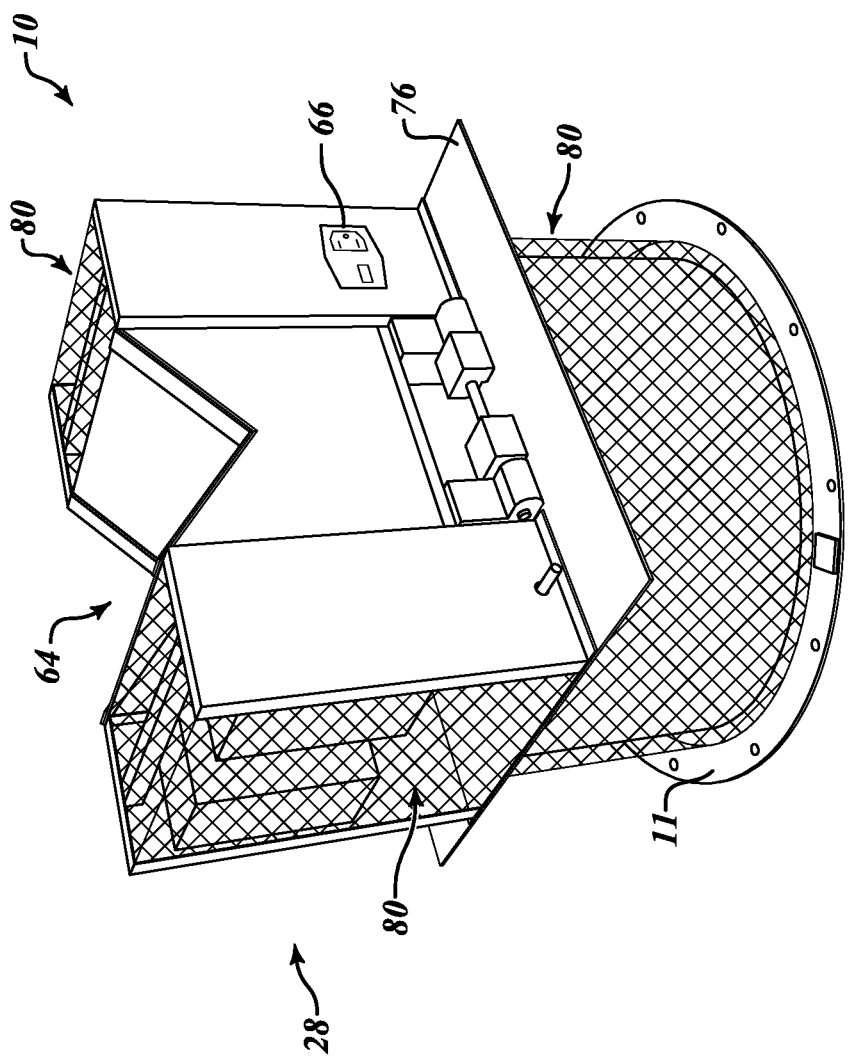
FIG. 9B is a rear perspective view of the system of FIG. 1.

Referring additionally to FIGS. 8, 9A, and 9B, in various embodiments a fan 72 is disposed in a central portion of the housing 64. In various embodiments the fan 72 is configured to provide cooling air downwardly to cool the electronic circuitry 22. In some embodiments the central portion of the housing 64 (that houses the fan 72) may be hingedly rotatable via a hinge assembly 74 to provide access to various components of the system 10.

In various embodiments the housing 64 and the components disposed therein (such as the power supplies 28, the line connector 66, the AC wire harnesses 68, the DC wire harnesses 70, and the fan 72) is mounted on a plate 76. In such embodiments the plate 76 is supported by retainer rods 78 removably attachable to the motherboard 11. The plate 76 is supported by the retainer rods 78 such that the plate 76 is vertically spaced apart from a top edge of the printed circuit boards 32. It will be appreciated that the electrical connectors 51 and electrical connections to the interface 24 extend through an opening (not shown) in the plate 76 (FIGS. 6B, 6C, 6D, 7A, and 7B).

In some embodiments, if desired portions of the system 10 (such as the power supplies 28 and the printed circuit boards 32) may be disposed within a cage 80 (FIGS. 9A and 9B). In such embodiments, the cage 80 may be made of a material, such as a wire mesh or the like, with openings defined therein sufficiently large to permit airflow therethrough. The cage 80 may also provide protection for the components disposed therein.

Figure 10:
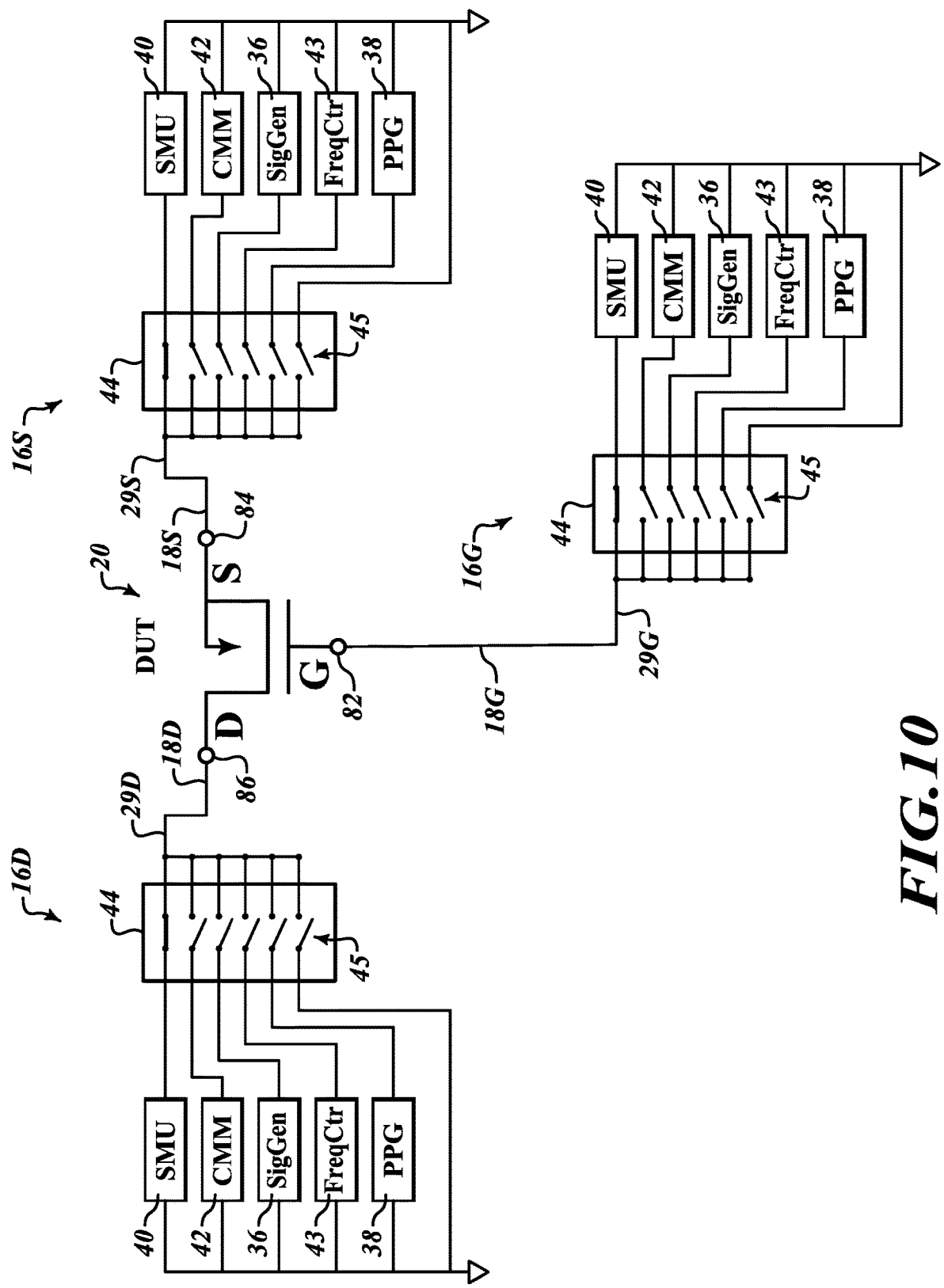
FIG. 10 is a block diagram in partial schematic form of testing cards of FIG. 5 configured to stimulate and measure a device under test.

Referring additionally to FIG. 10, various embodiments may operate as follows. A parametric testing system is disposed over a chuck of a silicon wafer prober. Electrical contact is established between the parametric testing system and at least a first pad of an associated device under test (DUT) of a silicon wafer. An analog stimulus signal is provided to a first pad of the DUT from a first testing card disposed proximal the first pad. A resultant analog parameter is measured from the first pad of the stimulated device under test by the first testing card. A digital signal indicative of the measured resultant analog parameter is transmitted.

In some embodiments, in disposing a parametric testing system over a chuck of a silicon wafer prober, at least the first testing card is inserted in at least a first electrical connector on a motherboard, a probe card is attached to the motherboard, and the motherboard is mounted over the chuck of the silicon wafer prober.

In some embodiments, in establishing electrical contact between the parametric testing system and at least a first pad of an associated device under test of a silicon wafer, a first probe tip of the probe card and the first pad are disposed in physical and electrical contact with each other.

In various embodiments a digital signal indicative of test plan instructions is received, and the analog stimulus signal is generated responsive to the test plan instructions. In some such embodiments, the test plan instructions may be translated from a format for a legacy testing system to a format for the parametric testing system.

In various embodiments the resultant analog parameter may include voltage, current, capacitance, and/or frequency.

In some embodiments, in transmitting a digital signal indicative of the measured resultant analog parameter, the digital signal indicative of the measured resultant analog parameter may be provided to a computing system via a computer interface.

Given by way of illustration only and not of limitation and as shown in FIG. 10, the DUT 20 may include a field-effect transistor (FET) with a gate terminal G, a source terminal S, and a drain terminal D that are each electrically connected to an associated probe pad 82, 84, and 86, respectively. A trace 29G from a parametric testing card 16G to a probe card is electrically connected to a probe 18G of the probe card which is, turn, electrically connected to the probe pad 82 (which is electrically connected to the gate terminal G). A trace 29S from a parametric testing card 16S to a probe card is electrically connected to a probe 18S of the probe card which is, turn, electrically connected to the probe pad 84 (which is electrically connected to the source terminal S). A trace 29D from a parametric testing card 16D to a probe card is electrically connected to a probe 18D of the probe card which is, turn, electrically connected to the probe pad 86 (which is electrically connected to the drain terminal D).

In response to test plan instructions, the signal generator circuit 36 and/or the pulse generator circuit 38 of the parametric testing cards 16G, 16S, and/or 16D may generate stimulus signals and the source measurement unit 40 of the parametric testing cards 16G, 16S, and/or 16D may force voltage or current signals to the probe pads 82, 84, and 86, respectively. Also in response to test plan instructions, the source measurement unit 40 of the parametric testing cards 16G, 16S, and/or 16D may acquire a resultant analog parameter which may be measured by the source measurement unit 40, the capacitance measurement unit 42, and/or the frequency counter of the parametric testing cards 16G, 16S, and/or 16D. It will be appreciated that appropriate electrical circuits of the parametric testing cards 16G, 16S, and/or 16D are electrically coupled to their respective probe pads 82, 84, and 86, as appropriate, by their associated reed relays 45 of the switching circuits 44 of the parametric testing cards 16G, 16S, and 16D, respectively.

Those skilled in the art will recognize that at least a portion of the devices and/or processes described herein can be integrated into a data processing system. Those having skill in the art will recognize that a data processing system generally includes one or more of a system unit housing, a video display device, memory such as volatile or non-volatile memory, processors such as microprocessors or digital signal processors, computational entities such as operating systems, drivers, graphical user interfaces, and applications programs, one or more interaction devices (e.g., a touch pad, a touch screen, an antenna, etc.), and/or control systems including feedback loops and control motors (e.g., feedback for sensing position and/or velocity; control motors for moving and/or adjusting components and/or quantities). A data processing system may be implemented utilizing suitable commercially available components, such as those typically found in data computing/communication and/or network computing/communication systems.

The term processor, as used in the foregoing/following disclosure, may refer to a collection of one or more components (such as computer processors and their components) that are arranged in a particular manner, or a collection of one or more general-purpose components that may be configured to operate in a particular manner at one or more particular points in time, and/or also configured to operate in one or more further manners at one or more further times. For example, the same hardware, or same portions of hardware, may be configured/reconfigured in sequential/parallel time(s) as a first type of processor (e.g., at a first time), as a second type of processor (e.g., at a second time, which may in some instances coincide with, overlap, or follow a first time), and/or as a third type of processor (e.g., at a third time which may, in some instances, coincide with, overlap, or follow a first time and/or a second time), etc. Reconfigurable and/or controllable components (e.g., general purpose processors, digital signal processors, field programmable gate arrays, etc.) are capable of being configured as a first processor that has a first purpose, then a second processor that has a second purpose and then, a third processor that has a third purpose, and so on. The transition of a reconfigurable and/or controllable component may occur in as little as a few nanoseconds, or may occur over a period of minutes, hours, or days.

In some such examples, at the time the component is configured to carry out the second purpose, the component may no longer be capable of carrying out that first purpose until it is reconfigured. A component may switch between configurations as different component in as little as a few nanoseconds. A component may reconfigure on-the-fly, e.g., the reconfiguration of a component from a first component into a second component may occur just as the second component is needed. A component may reconfigure in stages, e.g., portions of a first component that are no longer needed may reconfigure into the second component even before the first component has finished its operation. Such reconfigurations may occur automatically, or may occur through prompting by an external source, whether that source is another component, an instruction, a signal, a condition, an external stimulus, or similar.

For example, a central processing unit of a personal computer may, at various times, operate as a component for displaying graphics on a screen, a component for writing data to a storage medium, a component for receiving user input, and a component for multiplying two large prime numbers, by configuring its logical gates in accordance with its instructions. Such reconfiguration may be invisible to the naked eye, and in some embodiments may include activation, deactivation, and/or re-routing of various portions of the component, e.g., switches, logic gates, inputs, and/or outputs. Thus, in the examples found in the foregoing/following disclosure, if an example includes or recites multiple components, the example includes the possibility that the same hardware may implement more than one of the recited components, either contemporaneously or at discrete times or timings. The implementation of multiple components, whether using more components, fewer components, or the same number of components as the number of components, is merely an implementation choice and does not generally affect the operation of the components themselves. Accordingly, it should be understood that any recitation of multiple discrete components in this disclosure includes implementations of those components as any number of underlying components, including, but not limited to, a single component that reconfigures itself over time to carry out the functions of multiple components, and/or multiple components that similarly reconfigure, and/or special purpose reconfigurable components.

In some instances, one or more components may be referred to herein as "configured to," "configured by," "configurable to," "operable/operative to," "adapted/adaptable," "able to," "conformable/conformed to," etc. Those skilled in the art will recognize that such terms (for example "configured to") generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (for example, bodies of the appended claims) are generally intended as "open" terms (for example, the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (for example, "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (for example, the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (for example, "a system having at least one of A, B, and C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software (e.g., a high-level computer program serving as a hardware specification), firmware, or virtually any combination thereof, limited to patentable subject matter under 35 U.S.C. 101. In an embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, limited to patentable subject matter under 35 U.S.C. 101, and that designing the circuitry and/or writing the code for the software (e.g., a high-level computer program serving as a hardware specification) and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

With respect to the appended claims, those skilled in the art will appreciate that recited operations therein may generally be performed in any order. Also, although various operational flows are presented in a sequence(s), it should be understood that the various operations may be performed in other orders than those which are illustrated or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to,"

"related to," or other past-tense adjectives are generally not intended to exclude such variants, unless context dictates otherwise.

From the foregoing, it will be appreciated that specific embodiments of the present subject matter have been described herein for purposes of illustration, but that various modifications may be made without deviating from the spirit and scope of the present subject matter. Accordingly, the present subject matter is not limited except as by the appended claims.

What is claimed is:

1. A parametric testing card comprising:
a printed circuit board disposable over a chuck of a silicon wafer prober and proximal a probe for a pad of a device under test;
a plurality of electrical connectors disposed on the printed circuit board; and
electronic circuitry disposed on the printed circuit board and electrically connected to the plurality of electrical connectors, the electronic circuitry being configured to receive a digital signal indicative of test plan instructions, the electronic circuitry being further configured to generate an analog stimulus signal for a device under test responsive to the test plan instructions, the electronic circuitry being further configured to perform an analog measurement of a stimulated device under test, the electronic circuitry being further configured to transmit a digital signal indicative of the measurement of a device under test.

2. The parametric testing card of claim 1, wherein the plurality of electrical connectors includes a plurality of edge connectors.

3. The parametric testing card of claim 1, wherein each of the plurality of edge connectors is configured to be receivable in an associated zero-insertion-force connector.

4. The parametric testing card of claim 1, wherein the electronic circuitry includes at least one electronic circuit chosen from a digital-to-analog converter circuit, a signal generator circuit, a pulse generator circuit, a source measurement circuit, a capacitance measurement circuit, a switching circuit, an analog-to-digital converter circuit, and a digital data transceiver circuit.

5. The parametric testing card of claim 4, wherein the at least one electronic circuit includes at least one integrated circuit disposed on the printed circuit board.

6. A parametric testing system comprising:
a motherboard disposable over a chuck of a silicon wafer prober;
a plurality of first electrical connectors disposed on the motherboard and electrically connected to the motherboard;
at least one parametric testing card, each parametric testing card being disposable in physical and electrical contact with an associated one of the plurality of first electrical connectors proximal a probe for a pad of a device under test, each parametric testing card including electronic circuitry configured to receive a digital signal indicative of test plan instructions, the electronic circuitry being further configured to generate an analog stimulus signal for a device under test responsive to the test plan instructions, the electronic circuitry being further configured to perform an analog measurement of a stimulated device under test, the electronic circuitry being further configured to transmit a digital signal indicative of the measurement of a device under test;
an interface to a computing system, the interface being electrically connectable to the motherboard; and
at least one power supply electrically connectable to the motherboard.

7. The parametric testing system of claim 6, wherein the plurality of first electrical connectors includes a plurality of zero-insertion-force connectors.

8. The parametric testing system of claim 6, wherein the motherboard is configured to electrically connect ones of the plurality of first electrical connectors with a probe associated with a device under test.

9. The parametric testing system of claim 6, wherein each parametric testing card includes:
a printed circuit board, the electronic circuitry being disposed on the printed circuit board; and
a plurality of second electrical connectors disposed on the printed circuit board, the plurality of second electrical connectors being disposable in physical and electrical contact with an associated one of the plurality of first electrical connectors disposed on the motherboard.

10. The parametric testing system of claim 9, wherein the electronic circuitry includes at least one electronic circuit chosen from a digital-to-analog converter circuit, a signal generator circuit, a pulse generator circuit, a source measurement circuit, a capacitance measurement circuit, a frequency counter circuit, a switching circuit, an analog-to-digital converter circuit, and a digital data transceiver circuit.

11. The parametric testing system of claim 10, wherein the at least one electronic circuit includes at least one integrated circuit disposed on the printed circuit board.

12. The parametric testing system of claim 6, further comprising an extender board disposable in physical and electrical contact with an associated one of the plurality of first electrical connectors, the extender board being configured to electrically connect the at least one power supply with the motherboard and to connect the interface with the motherboard.

13. The parametric testing system of claim 6, further comprising a computing system operatively couplable to the interface.

14. A method comprising:
disposing a parametric testing system over a chuck of a silicon wafer prober;
establishing electrical contact between the parametric testing system and at least a first pad of an associated device under test of a silicon wafer;
providing to a first pad of the device under test an analog stimulus signal from a first testing card disposed proximal the first pad;
measuring a resultant analog parameter from the first pad of the stimulated device under test by the first testing card; and
transmitting a digital signal indicative of the measured resultant analog parameter.

15. The method of claim 14, wherein disposing a parametric testing system over a chuck of a silicon wafer prober includes:
inserting at least the first testing card in at least a first electrical connector on a motherboard;
attaching a probe card to the motherboard; and
mounting the motherboard over the chuck of the silicon wafer prober.

16. The method of claim 15, wherein establishing electrical contact between the parametric testing system and at least a first pad of an associated device under test of a silicon wafer includes disposing a first probe tip of the probe card and the first pad in physical and electrical contact with each other.

17. The method of claim 14, further comprising:
receiving a digital signal indicative of test plan instructions; and
generating the analog stimulus signal responsive to the test plan instructions.

18. The method of claim 17, further comprising translating test plan instructions from a format for a legacy testing system to a format for the parametric testing system.

19. The method of claim 14, wherein the resultant analog parameter includes at least one parameter chosen from voltage, current, capacitance, and frequency.

20. The method of claim 14, wherein transmitting a digital signal indicative of the measured resultant analog parameter includes providing the digital signal indicative of the measured resultant analog parameter to a computing system via a computer interface.

* * * * *